(12) United States Patent
Guillot et al.

(10) Patent No.: US 9,246,466 B2
(45) Date of Patent: Jan. 26, 2016

(54) DEVICE FOR LINKING AN ELECTRICAL MEMBER TO A COMMUNICATION LINE

(71) Applicant: SAGEM DEFENSE SECURITE, Boulogne Billancourt (FR)

(72) Inventors: Francois Guillot, Boulogne Billancourt (FR); Jean-Marie Courteille, Boulogne Billancourt (FR); Maxime Goullier, Boulogne Billancourt (FR); Michel Nollet, Boulogne Billancourt (FR)

(73) Assignee: SAGEM DEFENSE Securite, Boulogne Billancourt (FR)

( * ) Notice: Subject to any disclaimer, the term of this patent is extended or adjusted under 35 U.S.C. 154(b) by 0 days.

(21) Appl. No.: 14/406,961

(22) PCT Filed: Jul. 1, 2013

(86) PCT No.: PCT/EP2013/063829
§ 371 (c)(1),
(2) Date: Dec. 10, 2014

(87) PCT Pub. No.: WO2014/005994
PCT Pub. Date: Jan. 9, 2014

(65) Prior Publication Data
US 2015/0109073 A1  Apr. 23, 2015

(30) Foreign Application Priority Data

Jul. 6, 2012 (FR) ..................... 12 56501

(51) Int. Cl.
*H03H 7/09* (2006.01)
*H03H 7/01* (2006.01)
*H04B 3/28* (2006.01)
*H04B 3/30* (2006.01)
*H04L 25/02* (2006.01)

(52) U.S. Cl.
CPC ............. *H03H 7/09* (2013.01); *H03H 7/0138* (2013.01); *H03H 7/17* (2013.01); *H04B 3/28* (2013.01); *H04B 3/30* (2013.01); *H04L 25/0266* (2013.01); *H04L 25/0276* (2013.01)

(58) Field of Classification Search
CPC ..... H03H 1/0007; H03H 7/09; H03H 7/0138; H01P 1/266
USPC .......................................... 333/12, 22 R, 177
See application file for complete search history.

(56) References Cited

U.S. PATENT DOCUMENTS 4,409,569 A * 10/1983 Potash .................... H03H 7/075
333/168

(Continued)

FOREIGN PATENT DOCUMENTS

FR          2 937 199 A1    4/2010

*Primary Examiner* — Dean Takaoka
(74) *Attorney, Agent, or Firm* — Muncy, Geissler, Olds & Lowe, P.C.

(57) ABSTRACT

A connection device for connecting an electrical member to a communications line comprising at least two conductors for carrying differential signals. The connection device includes at least one data exchange interface component connected to the line to send and/or receive data, and a connection for connecting the electrical member to the line. The connection device also includes in succession, going from the connection to the interface components, at least a first transformer arranged to perform common mode filtering on each conductor of the communications line; a second transformer arranged to perform electrical isolation so as to isolate the communications line at least from the interface component; a third transformer connected in parallel with the second transformer and made up of two windings having terminals including terminals that are not connected to the second transformer and that are connected to frame ground of the electrical member; and a fourth transformer arranged to provide electrical isolation so as to isolate at least the interface component from frame ground.

7 Claims, 4 Drawing Sheets

(56) References Cited

U.S. PATENT DOCUMENTS

| | | | |
|---|---|---|---|
| 5,095,291 A * | 3/1992 | Staschover | H04B 3/30 333/12 |
| 5,801,602 A * | 9/1998 | Fawal | H01F 17/0006 333/177 |
| 5,825,259 A * | 10/1998 | Harpham | H04L 25/08 333/12 |
| 6,492,880 B1 * | 12/2002 | Chiappe | H04L 25/0266 333/22 R |
| 7,123,117 B2 * | 10/2006 | Chen | H01F 17/00 333/12 |
| 7,575,478 B1 | 8/2009 | Wei | |
| 8,537,727 B2 * | 9/2013 | Guillot | H04B 3/54 340/538 |
| 2012/0246496 A1 * | 9/2012 | Guillot | H04L 12/10 713/300 |

* cited by examiner

DEVICE FOR LINKING AN ELECTRICAL MEMBER TO A COMMUNICATION LINE

The invention relates to a connection device for connecting an electrical member to a communications line.

BACKGROUND OF THE INVENTION

In order to certify equipment for installing on board aircraft, it is necessary in particular to verify the behavior of that equipment when it is placed under environmental conditions similar to those that it might encounter on aircraft. The equipment is subjected to a battery of qualification tests, during which it is verified whether the equipment, when subjected to such environmental conditions, functions normally, or functions in an acceptable degraded mode, or is not damaged, or indeed disturbs the operation of other pieces of equipment. These tests generally include climatic tests (temperature, humidity, etc.), mechanical tests (vibration, impacts, etc.), electromagnetic compatibility tests, tests of ability to withstand lightning striking the aircraft, etc.

Among the electromagnetic compatibility tests, there are tests for susceptibility of radiofrequencies seeking to verify the behavior of an electrical member when it is exposed to a certain level of radiofrequency energy. These tests also include conductive susceptibility tests during which currents are injected into the cables connected to the electrical member at frequencies that are swept over a broad spectrum.

In order to verify the ability of the electrical member to withstand lightning strikes, tests are provided that are similar to the conductive susceptibility tests, and also current injection tests that are performed directly via the connectors of the equipment.

Certain electrical members that perform functions that are particularly critical, e.g. an electrical member used in an electrical flight control system, are required not only to be capable of withstanding such injected currents, but also to be capable of operating normally while such injection is taking place.

Thus, there are requirements for an electrical member to be capable of sending and receiving data in normal manner over a digital differential communications line even when a current of several hundreds of milliamps is injected into the line at frequencies varying over the range 100 kilohertz (kHz) to 400 megahertz (MHz). The injected current leads in particular to high levels of common mode disturbance that propagate along the conductors of the line.

In order to enable the electrical member to pass such a test successfully, it might be envisaged mounting a connection device on the electrical member for connecting it to the communications line via a first transformer having two windings connected in series with the respective conductors of the line, and a second transformer of the center-tapped type for electrically isolating the electrical member from the communications line. The second transformer would have a winding with two conventional connection terminals together with an additional connection terminal to the midpoint of the winding. Thus, a common mode disturbance generated by current being injected would be filtered by the transformers and discharged to frame ground of the electrical member via the center tap.

The use of such transformers would be effective, except when the common mode disturbance propagates at a frequency corresponding to a resonant frequency of the connection device due to an inductive component or the first transformer and a capacitive component of the second transformer. At such a resonant frequency, which gives rise to a great reduction in the impedance of the reception member and thus to a large increase in common mode current, there is a severe risk of a common mode disturbance damaging the components of the electrical member, or indeed interrupting communication.

OBJECT OF THE INVENTION

An object of the invention is to provide a connection device for connecting an electrical member to a differential communications line that makes it possible to avoid damaging the electrical member and to maintain communication over the line, even when the electrical member is subjected to a lightning test or to a conductive susceptibility test consisting in injecting current into the communications line at a varying frequency.

SUMMARY OF THE INVENTION

In order to achieve this object, the invention provides a connection device for connecting an electrical member to a communications line comprising at least two conductors for carrying differential signals, the connection device including at least one data exchange interface component connected to the line to send and/or receive data, and connection means for connecting the electrical member to the line, the connection device also including in succession, going from the connection means to the interface components, at least:
  a first transformer arranged to perform common mode filtering on each conductor of the communications line;
  a second transformer arranged to perform electrical isolation so as to isolate the communications line at least from the interface component;
  a third transformer connected in parallel with the second transformer and made up of two windings having terminals including terminals that are not connected to the second transformer and that are connected to frame ground of the electrical member; and
  a fourth transformer arranged to provide electrical isolation so as to isolate at least the interface component from frame ground.

When a current is injected into the communications line so as to generate a common mode disturbance at a frequency equal to a resonant frequency due to an inductive component of the first transformer and to a capacitive component of the second transformer, the third transformer, which presents zero impedance in common mode, discharges the disturbance to frame ground of the electrical member, regardless of the frequency of the disturbance. Thus, a common mode disturbance propagating at a resonant frequency of the device does not run the risk of damaging components of the electrical member nor of disturbing exchanges of data over the communications line.

The invention can be better understood in the light of the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

Figure 1:
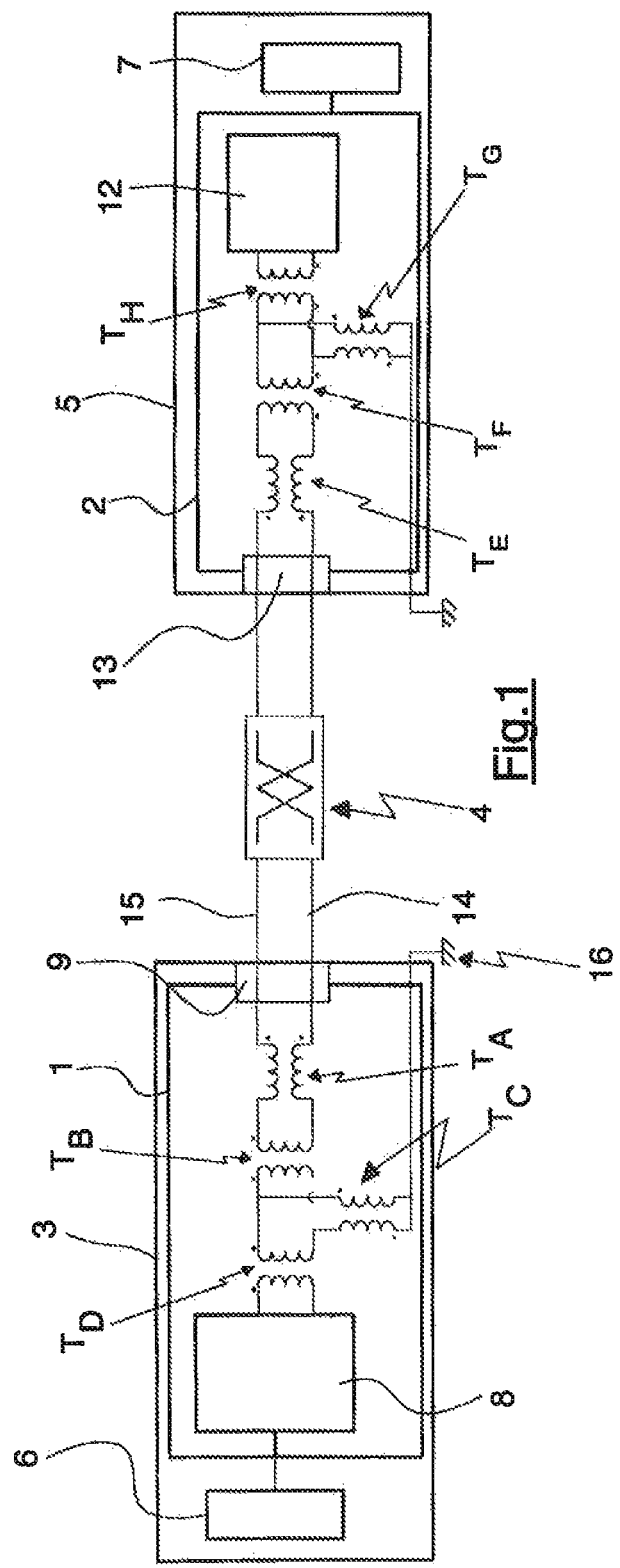
FIGS. 1 to 4 are electrical circuit diagrams of four different embodiments of a connection device of the invention.

With reference to FIG. 1, a connection device 1, 2 of the invention in a first embodiment is incorporated in a first electrical member 3 for sending data over a differential digital communications line 4, and in a second electrical member 5 for receiving the data. In this example, the data is transmitted over a simplex link, i.e. in one direction only between the first electrical member 3, which sends the data, and the second electrical member 5, which receives it.

In addition to the electrical connection device of the invention, each of the electrical members 3 and 5 has a respective control module 6, 7, e.g. a microcontroller or a field programmable gate array (FPGA), and one of its functions, for the first electrical member 3, is to generate the data that the first electrical member 3 is to send, and for the second electrical member 5, is to process the data received by the second electrical member 5, i.e. for example, to interpret the data, to store the data, or to forward the data. In the first and second electrical members, the data is respectively generated and received by the control module 6, 7 via connection devices 1, 2 of the invention.

The connection devices 1, 2 of the first electrical member 3 and of the second electrical member 5 comprise respectively:
- a data exchange interface component 8, 12;
- four transformers TA, TB, TC, TD, and TE, TF, TG, TH; and
- a connector 9, 13.

The term "data exchange interface component", is used to mean a component that can either send, or receive, or both send and receive simultaneously. In the description below, a distinction is drawn between a sender interface component and a receiver interface component. Naturally, this distinction does not prevent a sender interface component from also being capable of receiving data, or a receiver interface component from also being capable of sending data.

In this example, the data exchange interface component 8 is a sender interface component and the data exchange interface component 12 is a receiver interface component.

The sender and receiver interface components 8 and 12 are be provided with impedance-matching resistors (not shown) for optimizing the sending and reception of data over the communications line 4.

The connection devices 1, 2 of the first electrical member and of the second electrical member are thus identical, with the exception of the fact that unlike the interface component of the first electrical member, the interface component 12 of the second electrical member 5 is for receiving data and not for sending it. The present description relates solely to the arrangement and the advantages of the connection device 1 of the first electrical member 3, since they are equivalent in the second electrical member 5.

The sender interface component 8 of the connection device 1 of the first electrical member 3 is thus arranged to receive data from the control module 6 and to shape the data for making it comply with the Ethernet standard. The data is then sent via the transformers TA, TB, TC, TD and the connector 9 in differential mode over the communications line 4 that has two conductors 14 and 15.

Each of the four transformers TA, TB, TC, TD of the connection device 1 is made up of two windings having two terminals, with corresponding terminals being identified by dots in order to specify the beginning of each of the windings and thus the direction of the currents flowing in each winding.

The transformer TA is arranged in such a manner that each of its windings has one terminal connected to the connector 9 and is connected in series with a respective one of the conductors 14, 15 of the communications line 4, and so that the currents flowing in each of the windings flow in the same direction. The transformer TA thus has an inductive component that forms filter means suitable for filtering out common mode disturbances at high frequencies.

The transformer TB is arranged so that the two terminals of one of the windings of TB are connected to respective ones of the terminals of TA that are not connected to the connector 9. The transformer TB serves to isolate the communications line 4 electrically from the electrical components situated beyond the transformer TB, including the sender interface component 8. The currents flowing in each of the windings of TB flow in the same direction. The transformer TB thus has a capacitive component forming filter means that serve to limit low frequency common mode disturbances.

The transformer TC is connected in parallel with the transformer TB and is connected to a frame ground 16 of the electrical member 3 via its two terminals that are connected to the terminals of the transformer TB. Currents flow in each of the windings of the transformer TC in opposite directions.

When a common mode disturbance having a resonant frequency corresponds to a resonant frequency resulting from the inductive component of the transformer TA and the capacitive component of the transformer TB propagates on the conductors 14 and 15 of the communications line 4, it is discharged to frame around 16 via the transformer TC, without damaging the electrical component of the electrical member 3.

It should be observed that the transformer TC presents very high impedance in differential mode, and therefore does not degrade the data sent by the sender interface component to the second electrical member.

Finally, the transformer TD is arranged in such a manner that the two terminals of a common winding of the transformer TD are each connected to a respective terminal of the winding of the transformer TB that is not connected to the transformer TA, and in such a manner that the two terminals of the other winding of the transformer TD are connected to the sender interface component 8. The transformer TD serves to isolate the frame ground electrically from the electrical components situated beyond the transformer TD, including the sender interface component 8. The currents flowing in each of the windings of the transformer TD flow in the same direction.

The connection device of the invention as described above thus makes it possible, without degrading the data that is sent, to provide effective filtering at low frequencies and at high frequencies, and to eliminate common mode disturbances at a frequency corresponding to a resonant frequency resulting from the capacitive and inductive components of the device.

Figure 2:
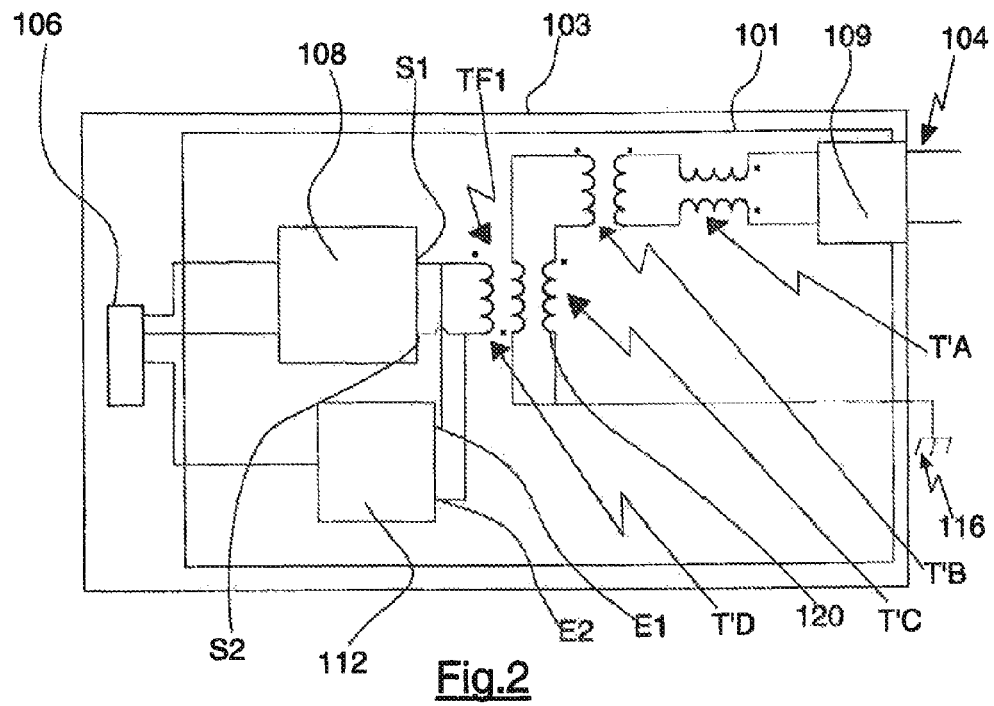

With reference to FIG. 2, a connection device 101 of the invention in a second embodiment may be incorporated in a first electrical member 103 for sending data and for receiving data over a differential digital communications line 104, this data being exchanged with a second electrical member (not shown in FIG. 2) that is also provided with a connection device of the invention. In this example, data is exchanged over a half-duplex link, i.e. data flows in one direction or the other between the first electrical member 103 and the second electrical member, but not in both directions simultaneously.

The first electrical member naturally has a control module 106 arranged in particular to perform the functions that are performed by the send and receive control modules described above (generating, receiving, and processing data).

The connection device 101 of the invention in the first electrical member 103 in this example comprises a sender interface component 108 and a receiver interface component 112, for sending and receiving data, together with four transformers T'A, T'B, T'C, T'D and a connector 109. The interface components are provided with impedance-matching resistors.

The sender interface component 108 has two outputs S1 and S2 that are connected to two inputs E1 and E2 of the receiver interface component 112, thereby enabling the first electrical member to send and to receive data in alternation over the communications line 104.

Each of the four transformers T'A, T'B, T'C, T'D are made up of two windings, each having two terminals. The transformers have functions similar to those described for the first terminal, and the currents flowing in each winding flow in directions similar to those of the first embodiment. Nevertheless, the transformers T'C and T'D in this example are each made up of two windings selected from three windings of a transformer device TF1, specifically a three-winding transformer.

The transformers T'A and T'B are arranged in similar manner to the transformers TA and TB of FIG. 1. Each winding of the transformer T'C has a terminal connected to a terminal T'B that is not connected to T'A. The terminals of T'C that are not connected to T'B are connected to frame ground 116 of the first electrical member 103. A winding 120 of the transformer T'D is common with a winding of T'C. The terminals of the other winding of T'D are connected to the outputs S1, S2 of the sender interface component 108 and to the inputs E1, E2 of the receiver interface component 112.

The three-winding transformer TF1 thus has one winding 120 that is used for both transformers T'C and T'D, thereby firstly simplifying the device, and secondly enabling transformation energy losses to be reduced (Joule losses, no-load losses, etc.). This reduction in losses improves the quality of data transmission via the transformers, and improves discharging common mode disturbances to frame ground 116 of the electrical member 103.

Figure 3:
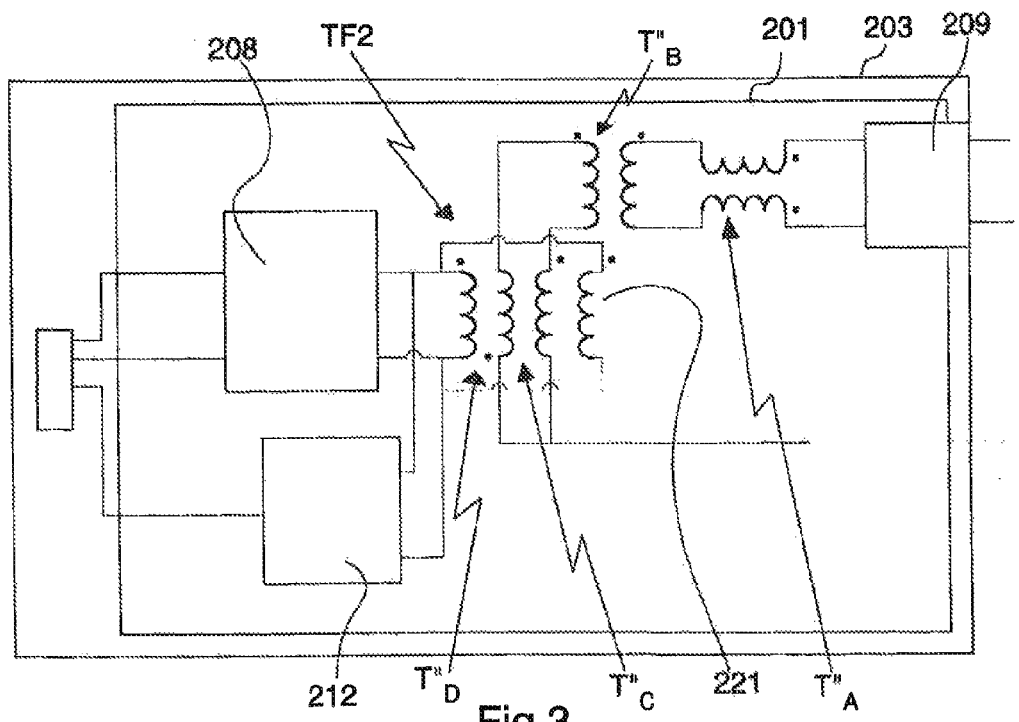

With reference to FIG. 3, a connection, device 201 of the invention in a third embodiment is once more incorporated in a first electrical member 203 for exchanging data over a half-duplex link. The connection device 201 of the invention once more has a sender interface component 208 and a receiver interface component 212, four transformers T"A, T"B, T"C, T"D, and a connector 209. The transformers T"A, T"B, T"C, T"D have functions similar to those described for the first embodiment. They are made up of windings in which currents flow in directions similar to those of the first two embodiments. The third embodiment of the invention is similar to the second embodiment of the invention with the exception that the connection device in this example is provided with a four-winding transformer device TF2, the extra winding 221 being connected in parallel with a winding of T"D having its terminals connected to the sender interface component 208 and to the receiver interface component 212. The four-winding transformer TF2 is easier to balance than the three-winding transformer TF1, i.e. it is easier to design the transformer in such a manner as to ensure that currents flow symmetrically through the terminal.

Figure 4:
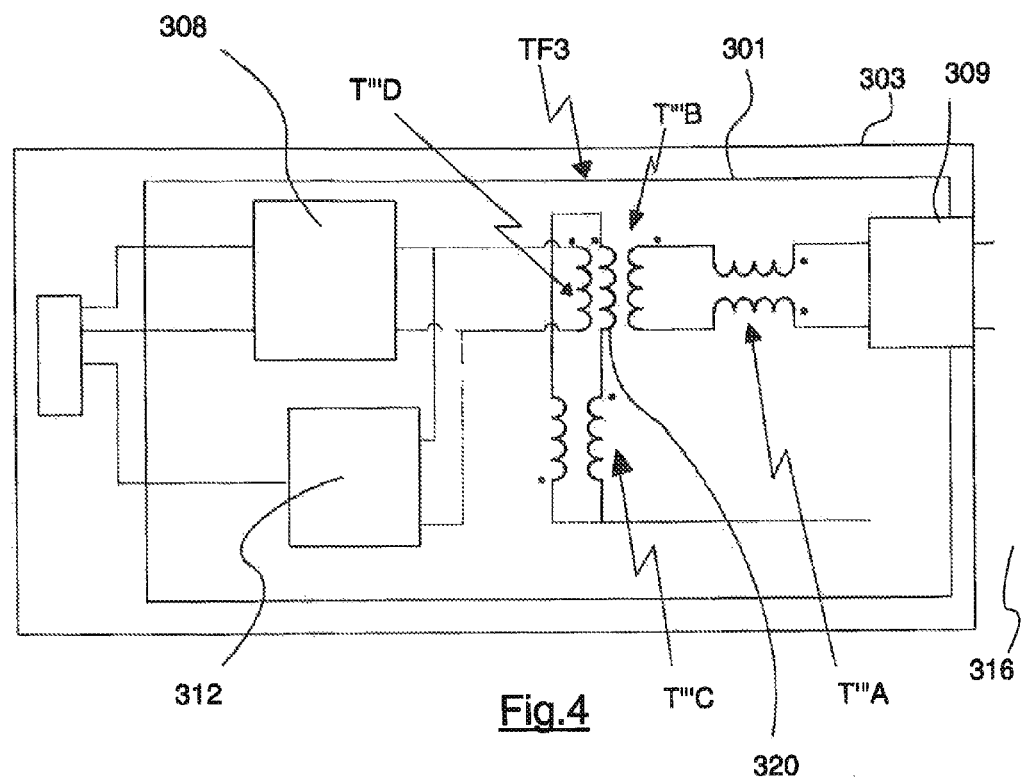

With reference to FIG. 4, a connection device 301 of the invention in a fourth embodiment is once more incorporated in a first electrical member 303 for exchanging data over a half-duplex link. Once more the connection device has a sender interface component 308 and a receiver interface component 312, four transformers T'''A, T'''B, T'''C, T'''D, and a connector 309.

In this example, each of the transformers T'''B, T'''D is made up of two windings taken from three windings of a transformer device TF3, in this example a three-winding transformer.

The transformer T'''A is arranged in similar to the transformer TA of FIG. 1. The transformer T'''B is arranged in such a manner that the two terminals of one of the windings of the transformer T'''B are connected to respective terminals of the transformer T'''A that are not connected to the connector 309. A winding 320 of the transformer T'''B that is not connected to the transformer T'''A is common to the transformers T'''B and T'''D. The other winding of the transformer T'''D is connected to the sender and receiver interface components 308 and 312. Each winding of the transformer T'''C has a terminal connected to the winding 320. The terminals of the transformer T'''C that are not connected to the winding 220 are connected to frame ground 316 of the first electrical member 303.

The winding 320 is thus used by both transformers T'''B and T'''D. This once more makes it possible to simplify the device, to reduce losses, to facilitate balancing, and also to eliminate the capacitive coupling that exists in the above-described embodiments between the transformer TC or T'C or T"C and the frame ground of the electrical member.

Figure 5:
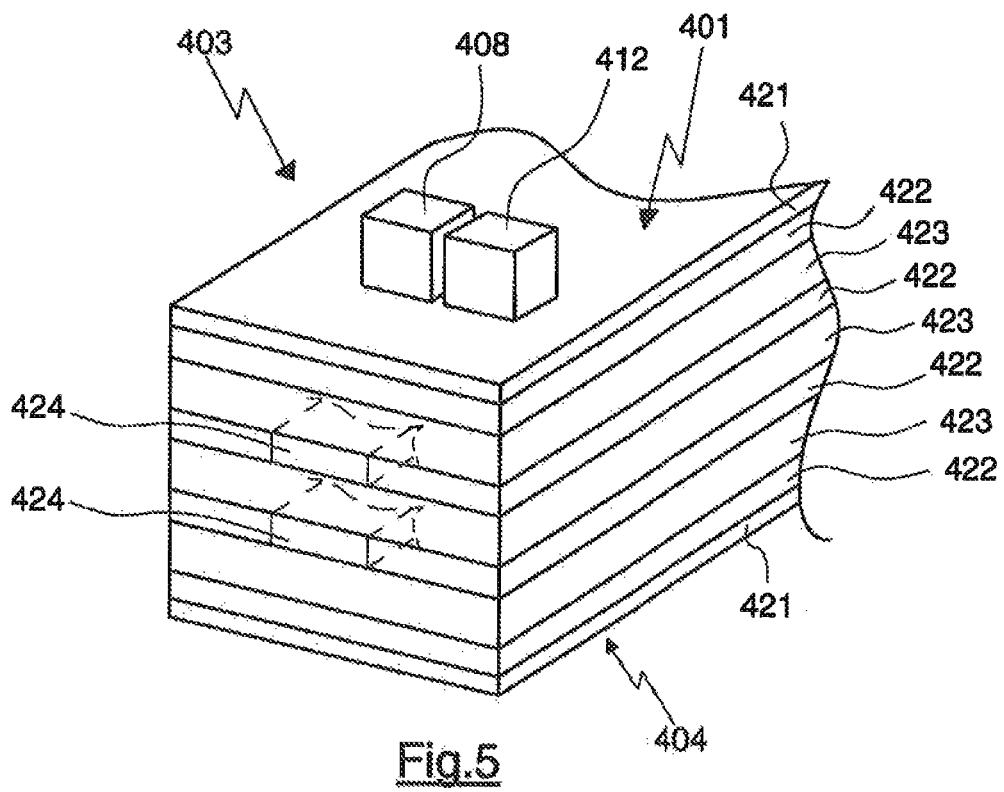
FIG. 5 shows a connection device of the invention in which transformer windings are constituted by track windings of a printed circuit.

In order to fabricate the connection device of the invention, provision may be made for the windings of the transformers to be made by using printed circuit track windings. Advantageously, and with reference to FIG. 5 which shows layers of varnish 421, of copper 422, and of insulation 423 in a printed circuit 404 of an electrical member 403, the track windings 424 of the transformers of a device 401 of the invention are distributed over the inner copper layers of the printed circuit 404, and the sender and receiver interface components 408 and 412 are mounted on a surface copper layer. The transformers therefore do not require magnetic cores, and they therefore do not present any risk of saturation caused by magnetic flux that is too strong for a core. Such an arrangement also makes it possible to make the connection device on a small area of the printed circuit board (PCB), to ensure satisfactory industrial reproducibility, etc.

Figure 6:
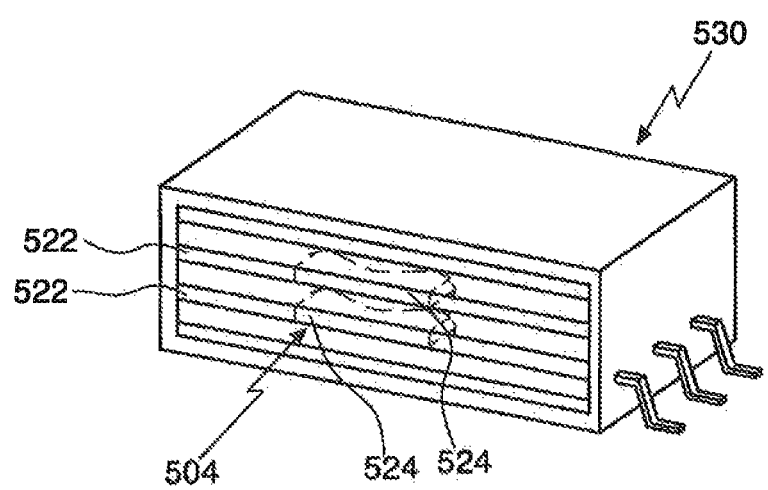
FIG. 6 shows transformer windings of a connection device of the invention incorporated within a single discrete component.

With reference to FIG. 6, it is also possible to make provision for incorporating track windings 524 of transformers that are made on copper layers 522 of a printed circuit 504 directly in a discrete component 530, e.g. a ball grid array (BGA) package.

The invention is not limited to the particular embodiments described above, but on the contrary covers any variant coming within the ambit of the invention as defined by the claims.

Although the connection device of the first embodiment is used in first and second electrical members communicating over a simplex link, it is possible to use that device in a half-duplex link. Each electrical member should then be provided with, a sender data exchange interface component and with a receiver data exchange interface component, which components are connected together in a manner similar to the devices of the other embodiments and are connected to a single set of transformers, or else are connected to respective sets of transformers. Likewise, it is possible to use the connection devices of the other embodiments with a simplex link. Each electrical member is then provided with only one interface component of the sender type or or the receiver type.

The invention claimed is:

1. A connection device for connecting an electrical member to a communications line comprising at least two conductors for carrying differential signals, the connection device including at least one data exchange interface component connected to the line to send and/or receive data, and connection means (9, 13; 109) for connecting the electrical member to the line, the connection device also including in succession, going from the connection means to the interface components, at least:
- a first transformer arranged to perform common mode filtering on each conductor of the communications line;
- a second transformer arranged to perform electrical isolation so as to isolate the communications line at least from the interface component;
- a third transformer connected in parallel with the second transformer and made up of two windings having terminals including terminals that are not connected to the second transformer and that are connected to frame ground of the electrical member; and
- a fourth transformer arranged to provide electrical isolation so as to isolate at least the interface component from frame ground.

2. The connection device according to claim 1, wherein the third and fourth transformers are formed respectively by a first winding and a second winding, and by the second winding and a third winding of a three-winding transformer device.

3. The connection device according to claim 1, wherein the second and fourth transformers are formed respectively by a first winding and a second winding, and by the second winding and a third winding of a three-winding transformer device.

4. The connection device according to claim 1, wherein the third transformer and the fourth transformer are formed respectively by a first winding and a second winding, and by the second winding and a third winding in parallel with a fourth winding of a four-winding transformer device.

5. The connection device according to claim 1, including a sender data exchange interface component and a receiver data exchange interface component, outputs of the sender type interface component and inputs of the receiver type interface component being connected together in such a manner that the interface components can send and receive data over the communications line via the transformers.

6. The connection device according to claim 1, wherein at least one of the transformers is made by track windings of a printed circuit.

7. The connection device according to claim 6, wherein all of the transformers are made by track windings of a printed circuit and incorporated within a common discrete component.

* * * * *